(12) United States Patent
Huber et al.

(10) Patent No.: US 8,934,507 B2
(45) Date of Patent: Jan. 13, 2015

(54) WAVELENGTH-TUNABLE LIGHT SOURCE

(75) Inventors: Robert Alexander Huber, Schnaitsee (DE); Wolfgang Wieser, Munich (DE); Thomas Klein, Garching (DE)

(73) Assignee: Ludwig-Maximilians-Universitaet Muenchen, Munich (DE)

( * ) Notice: Subject to any disclaimer, the term of this patent is extended or adjusted under 35 U.S.C. 154(b) by 255 days.

(21) Appl. No.: 13/496,679

(22) PCT Filed: Sep. 16, 2010

(86) PCT No.: PCT/EP2010/063633
§ 371 (c)(1),
(2), (4) Date: May 29, 2012

(87) PCT Pub. No.: WO2011/033031
PCT Pub. Date: Mar. 24, 2011

(65) Prior Publication Data
US 2012/0230354 A1    Sep. 13, 2012

(30) Foreign Application Priority Data

Sep. 18, 2009   (DE) .................. 10 2009 042 207

(51) Int. Cl.
| | |
|---|---|
| *H01S 3/102* | (2006.01) |
| *H01S 5/14* | (2006.01) |
| *H01S 3/067* | (2006.01) |
| *H01S 3/08* | (2006.01) |
| *H01S 3/083* | (2006.01) |

(Continued)

(52) U.S. Cl.
CPC ............ *H01S 5/146* (2013.01); *H01S 3/06791* (2013.01); *H01S 3/08013* (2013.01); *H01S 3/083* (2013.01); *H01S 3/1062* (2013.01); *H01S 3/1109* (2013.01)
USPC ................. 372/6; 372/20; 372/43.01; 372/94

(58) Field of Classification Search
USPC ....................................... 372/6, 20, 43.01, 94
See application file for complete search history.

(56) References Cited

U.S. PATENT DOCUMENTS

| | | | |
|---|---|---|---|
| 4,204,745 A | * | 5/1980 | Sakai et al. .................. 385/124 |
| 5,077,815 A | | 12/1991 | Yoshizawa et al. |
| 5,416,862 A | | 5/1995 | Haas et al. |

(Continued)

FOREIGN PATENT DOCUMENTS

| | | |
|---|---|---|
| DE | 38 52 737 T2 | 8/1995 |
| DE | 10 2006 023 976 A1 | 4/2007 |

(Continued)

OTHER PUBLICATIONS

Adler, D. et al., "Comparison of three-dimensional optical coherence tomography and high resolution photography for art conservation studies," Optics Express, vol. 15, No. 24, Nov. 26, 2007, pp. 15972-15986.

(Continued)

*Primary Examiner* — Yuanda Zhang
*Assistant Examiner* — Michael Carter
(74) *Attorney, Agent, or Firm* — Slater & Matsil, L.L.P.

(57) ABSTRACT

In at least one embodiment, a wavelength-tunable light source includes at least one fiber-based partial section and at least one delay section. For a wavelength λ of at least one portion of a radiation emitted by the light source as a function of time t, the relationship $\lambda(t)=\lambda(t-\tau)$ holds true. In this case, τ is a specific period of time. Furthermore, the delay section includes one or more oligomode fibers.

20 Claims, 5 Drawing Sheets

(51) Int. Cl.
 H01S 3/106 (2006.01)
 H01S 3/11 (2006.01)

(56) References Cited

U.S. PATENT DOCUMENTS

| | | |
|---|---|---|
| 2005/0041702 A1 | 2/2005 | Fermann et al. |
| 2006/0072632 A1 | 4/2006 | Flanders et al. |
| 2006/0187537 A1 | 8/2006 | Huber et al. |
| 2008/0181263 A1* | 7/2008 | Bouma et al. .................... 372/20 |
| 2009/0174931 A1* | 7/2009 | Huber et al. .................. 359/340 |
| 2009/0219959 A1 | 9/2009 | Murison et al. |

FOREIGN PATENT DOCUMENTS

| | | |
|---|---|---|
| EP | 1 139 521 A1 | 10/2001 |
| EP | 1 271 194 A2 | 1/2003 |
| WO | WO 03/096106 A1 | 11/2003 |
| WO | WO 2006/079078 A2 | 7/2006 |
| WO | WO 2008/135034 A1 | 11/2008 |

OTHER PUBLICATIONS

Adler, D. et al., "Phase-sensitive optical coherence tomography at up to 370,000 lines per second using buffered Fourier domain mode-locked lasers," Optics Letters, vol. 32, No. 6, Mar. 15, 2007, pp. 626-628.
Adler, D. et al., "Photothermal detection of gold nanoparticles using phase-sensitive optical coherence tomography," Optics Express, vol. 16, No. 7, Mar. 31, 2008, pp. 4376-4393.
Adler, D. et al., "Three-dimensional endomicroscopy using optical coherence tomography," Nature Photonics, vol. 1, No. 12, Dec. 2007, pp. 709-716.
Axsun Technologies, "Agile MEMS Devices," http://www.axsun.com/html/tech_agile.htm, 1 page, Aug. 29, 2003.
Biedermann, B., et al., "Dispersion, coherence and noise of Fourier domain mode locked lasers," Optics Express, vol. 17, No. 12, Jun. 8, 2009, pp. 9947-9961.
Biedermann, B., et al., "Real time en face Fourier-domain optical coherence tomography with direct hardware frequency demodulation," Optics letters, vol. 33, No. 21, Nov. 1, 2008, pp. 2556-2558.
Chen, D., et al., "Multiple fiber Bragg grating interrogation based on a spectrum-limited Fourier domain mode-locking fiber laser," Optics Letters, vol. 33, No. 13, Jul. 1, 2008, pp. 1395-1397.
Corning, "HI 1060 Specialty Fiber; Single-mode Component Fiber for High Performance Photonic Applications," Corning, Inc., PI1263, Issued Aug. 2003, 2 pages.
Corning, "SMF-28 Optical Fiber; Product Information," Corning Inc., PI1036, Issued Apr. 2002, 4 pages.
Eigenwillig, C., et al., "K-space linear Fourier domain mode locked laser and applications for optical coherence tomography," Optics Express, vol. 16, No. 12, Jun. 9, 2008, pp. 8916-8937.
Fermann, M., "Single-mode excitation of multimode fibers with ultrashort pulses," Optics Letters, vol. 23, No. 1, Jan. 1, 1998, pp. 52-54.
Gloge, D., "Weakly Guiding Fibers," Applied Optics, vol. 10, No. 10, Oct. 1971, pp. 2252-2258.
Huang, D., et al., "Optical Coherence Tomography," Science, vol. 254, No. 5035, Nov. 22, 1991, pp. 1178-1181.
Huang, S-W., et al., "Swept source optical coherence microscopy using a Fourier domain mode-locked laser," Optics Express, vol. 15, No. 10, May 14, 2007, pp. 6210-6217.
Huber, R., "Fourier domain mode locking: new lasers for optical coherence tomography," SPIE Newsroom, Feb. 3, 2009, http://spie.org/x33321.xml?pf=true&ArticleID=x33321, 4 pages.

Huber, R., et al., "Fourier domain mode locking at 1050nm for ultra-high-speed optical coherence tomography of the human retina at 236,000 axial scans per second," Optics Letters, vol. 32, No. 14, Jul. 15, 2007, pp. 2049-2051.
Huber, R., et al., "Fourier Domain Mode Locking (FDML): A new laser operating regime and applications for optical coherence tomography," Optics Express, vol. 14, No. 8, Apr. 17, 2006, pp. 3225-3237.
Huber, R., et al., "Buffered Fourier domain mode locking: unidirectional swept laser sources for optical coherence tomography imaging at 370,000 lines/s," Optics Letters, vol. 31, No. 20, Oct. 15, 2006, pp. 2975-2977.
Huber, R., et al., "Fourier Domain Mode Locked (FDML) lasers at 1050 nm and 202,000 sweeps per second for OCT retinal imaging," Proc. of SPIE, vol. 6429, 2007, pp. 642907-1-642907-7.
ITU-T, "Series G: Transmission Systems and Media, Digital Systems and Networks; Transmission Media Characteristics—Optical Fibre Cables; Characteristics of a Single-mode Optical Fibre Cable," ITU-T Recommendation G.652, Oct. 2000, 24 pages.
Jenkins, M., et al., "Ultrahigh-speed optical coherence tomography imaging and visualization of the embryonic avian heart using a buffered Fourier Domain Mode Locked laser," Optics Express, vol. 15, No. 10, May 14, 2007, pp. 6251-6267.
Jeon, M., et al., "Characterization of Fourier domain mode-locked wavelength swept laser for optical coherence tomography imaging," Optics Express, vol. 16, No. 6, Mar. 17, 2008, pp. 3727-3737.
Jeon, M., et al., "High-speed and wide bandwidth Fourier domain mode-locked wavelength swept laser with multiple SOAs," Optics Express, vol. 16, No. 4, Feb. 18, 2008, pp. 2547-2554.
Jung, E., et al., "Characterization of FBG sensor interrogation based on a FDML wavelength swept laser," Optics Express, vol. 16, No. 21, Oct. 13, 2008, pp. 16552-16560.
Jung, Y., et al., "Broadband single-mode operation of standard optical fibers by using a sub-wavelength optical wire filter," Optics Express, vol. 16, No. 19, Sep. 15, 2008, pp. 14661-14667.
Klein, T., et al., "Raman-pumped Fourier-domain mode-locked laser: analysis of operation and application for optical coherence tomography," Optics Letters, vol. 33, No. 23, Dec. 1, 2008, pp. 2815-2817.
Kranendonk, L., et al., "High speed engine gas thermometry by Fourier-domain mode-locked laser absorption spectroscopy," Optics Express, vol. 15, No. 23, Nov. 12, 2007, pp. 15115-15128.
Kranendonk, L., et al., "Wavelength-agile H2O absorption spectrometer for thermometry of general combustion gases," Proceedings of the Combustion Institute, vol. 31, No. 1, Jan. 2007, pp. 783-790.
Kuznetsov, M., et al., "Single transverse mode optical resonators," Optics Express, vol. 13, No. 1, Jan. 10, 2005, pp. 171-181.
Palte, G., et al., "Fourier Domain Mode Locked (FDML) Lasers for Polarization Sensitive OCT," Proc. of SPIE-OSA Biomedical Optics, vol. 7372, Jun. 17, 2009, pp. 73720M-1-73720M-6.
Poole, C., et al., "Bend-induced loss for the higher-order spatial mode in a dual-mode fiber," Optics Letters, vol. 18, No. 20, Oct. 15, 1993, pp. 1712-1714.
Poole, C., et al., "Broadband dispersion compensation by using the higher-order spatial mode in a two-mode fiber," Optics Letters, vol. 17, No. 14, Jul. 15, 1992, pp. 985-987.
Srinivasan, V., et al., "Ultrahigh-Speed Optical Coherence Tomography for Three-Dimensional and En Face Imaging of the Retina and Optic Nerve Head," Investigative Ophthalmology & Visual Science, vol. 49, No. 11, Nov. 2008, pp. 5103-5110.
Stacey, C., "Demonstration of fundemental mode only propogation in highly multimode fibre for high power EDFAs," Optics Communications, vol. 269, 2007, pp. 310-314.
Yun, S., et al., "High-speed optical frequency-domain imaging," Optics Express, vol. 11, No. 22, Nov. 3, 2003, pp. 2953-2963.
Yun, S., et al., "High-speed wavelength-swept semiconductor laser with a polygon-scanner-based wavelength filter," Optics Letters, vol. 28, No. 20, Oct. 15, 2008, pp. 1981-1983.

* cited by examiner

WAVELENGTH-TUNABLE LIGHT SOURCE

This patent application is a national phase filing under section 371 of PCT/EP2010/063633, filed Sep. 16, 2010, which claims the priority of German patent application 10 2009 042 207.2, filed Sep. 18, 2009, each of which is incorporated herein by reference in its entirety.

TECHNICAL FIELD

A wavelength-tunable light source is specified.

BACKGROUND

A device and a method for mode locking are specified in the document US 2006/187537 A1.

U.S. Pat. No. 5,077,815 relates to a device for optically connecting a single mode fiber to a multimode fiber.

A lightwave transmission system which uses selected optical modes is described in U.S. Pat. No. 5,416,862.

International Patent Publication WO 2008/135034 A1 relates to a wavelength-tunable laser.

SUMMARY

One aspect of the invention specifies a wavelength-tunable light source including an oligomode fiber, wherein the light source exhibits a high efficiency.

In accordance with at least one embodiment, the light source is wavelength-tunable and/or wavelength-variable. In other words, a wavelength and/or spectral composition of a radiation emitted by the light source are/is not constant during operation, but rather subject to a targeted temporal change.

In accordance with at least one embodiment, the light source comprises one or a plurality of fiber-based partial sections. In other words, the one or the plurality of partial sections is or are based on an optical waveguide, for example, on an optical fiber. In particular, a partial section is a continuous and/or uninterrupted piece of an optical waveguide, in particular of exactly one single optical waveguide.

In accordance with at least one embodiment, the light source includes one or a plurality of delay sections. The delay sections are designed to bring about over their optical length a temporal delay of a light passing through the delay sections. In particular, the one or the plurality of delay sections is or are passive elements. In other words, it is possible that no optical amplification and no spectral filtering and no switching-on or switching-off of a radiation generated by the light source take place in the at least one delay section.

In accordance with at least one embodiment of the light source, an amplification is achieved in the delay section in particular by stimulated Raman scattering.

In accordance with at least one embodiment of the light source, for a wavelength $\lambda$ of at least one portion of the radiation emitted by the light source as a function of the time t, the following relationship holds true:

$$\lambda(t)=\lambda(t-\tau)$$

In this case, $\tau$ is a fixed period of time. That is to say that it is possible that at a specific time the light source emits a light pulse or an optical wave train having a specific spectral signature and emits a copy or a duplicate of the light pulse after the period of time $\tau$. In other words, wavelength tuning is effected periodically or partly periodically.

In accordance with at least one embodiment of the light source, the delay section is formed partly or, preferably, completely with one or with a plurality of oligomode fibers. In other words, the delay section includes an oligomode fiber or consists of such a fiber. That is to say that the delay section, at least in places, is not formed by a single mode fiber ("SMF"), nor by a multimode fiber, which guides in particular hundreds of modes, such as, for example, fibers having a core diameter of 50 μm or 62.5 μm. This applies, in particular, to the spectral range in which the light source emits radiation during operation. Preferably, the delay section is based completely on optical waveguides such as optical fibers. It is possible for the delay section to be formed by a single, interrupted and/or continuous optical waveguide, in particular the oligomode fiber.

In accordance with at least one embodiment of the light source, the oligomode fiber in a wavelength range of the radiation emitted by the light source during operation guides between two modes and 20 modes inclusive, preferably between two modes and 12 modes inclusive, particularly preferably between two modes and five modes inclusive. In this case, a mode should be understood to mean, in particular, a specific intensity profile in the fiber, as seen in a cross section. The modes can, therefore, be spatially transverse modes. Different polarization directions of a mode should not be counted as dedicated modes. The modes are counted, for example, as indicated in the document D. Gloge, Weakly Guiding Fibers, Applied Optics, Vol. 10, Issue 10, pages 2252 to 2258, from 1971. The disclosure content of the document with regard to the counting of the modes is hereby incorporated by reference.

In accordance with at least one embodiment of the light source, oligomode fiber denotes an oligomode fiber specified according to the document "INTERNATIONAL TELECOMMUNICATION UNION" ITU-T G.652, for example, having in particular between two and 20 modes inclusive, particularly if the light source is operated in a spectral range of between 980 nm and 1150 nm inclusive. The disclosure content of the document with regard to a specification of the fiber is hereby incorporated by reference. Examples of such oligomode fibers are the fiber types SMF28 from Corning, Allwave ZWP from OFS or FutureGuide®-SM from Fujikura.

In accordance with at least one embodiment of the light source, oligomode fiber denotes a single mode fiber if the single mode fiber is provided at least partly for operation in the wavelength range of between 30% and less than 100% inclusive of the so-called single mode cut-off wavelength. The light source is preferably operated between 60% and less than 100% inclusive, particularly preferably between 75% and less than 100% inclusive, relative to the single mode cut-off wavelength.

In accordance with at least one embodiment of the light source, oligomode fiber denotes an optical fiber whose single mode cut-off wavelength is specified according to ITU-T G.650, from April 1997, SERIES G: TRANSMISSION SYSTEMS AND MEDIA, DIGITAL SYSTEMS AND NETWORKS Transmission media characteristics—Optical fiber cables—DEFINITION AND TEST METHODS FOR THE RELEVANT PARAMETERS OF SINGLE MODE FIBERS ITU-T, and which is operated at least partly below the single mode cut-off wavelength.

In at least one embodiment of the wavelength-tunable or wavelength-variable light source, the light source includes at least one fiber-based partial section and at least one delay section. The light source is designed such that for a wavelength $\lambda$ of at least one portion of a radiation emitted by the light source as a function of the time t, the relationship $\lambda(t)=\lambda(t-\tau)$ holds true. In this case, $\tau$ is a specific period of time greater than zero. Furthermore, the delay section includes one or a plurality of oligomode fibers.

In connection with the wavelength-tunable light source, it has surprisingly been found that an oligomode fiber can be used instead of a single mode fiber for a delay section. Particularly in the case of Fourier domain mode locked lasers ("FDML"), generally particularly great care has to be employed to ensure a precise temporal tuning of spectral components within a radiation propagation section.

By using an oligomode fiber instead of a single mode fiber, it might be expected that mode dispersion occurs in the oligomode fiber and, as a result, temporal smearing of the radiation occurs in the oligomode fiber. Surprisingly, however, this effect occurs only to a reduced extent or does not occur. One possible explanation for this might be that, particularly in the spectral range around 1050 nm, conventional optical waveguides, in contrast to the spectral range around 1300 nm, have no dispersion zero point with respect to the wavelength of the radiation. As a result of the multimode operation, therefore, a chromatic dispersion might be reduced in the delay section, since the chromatic dispersion and the mode dispersion might partly or completely compensate for one another.

Furthermore, fiber-based light sources in general necessarily include single mode fibers at least in places. In the case of FDML lasers comprising at least one fiber Fabry-Perot filter, for example, it is necessary for the fibers at the filter to be single mode fibers, in order to suppress spectral sidebands. On account of different core diameters of the single mode fiber and of the oligomode fiber, it should be expected that high losses occur when coupling the oligomode fiber to the single mode fiber.

Surprisingly, however, it would appear to be the case that the losses occurring when coupling the oligomode fiber to the single mode fiber are compensated or overcompensated for by the fact that an attenuation of the oligomode fiber particularly in the spectral range around 1050 nm is significantly lower than an attenuation of a single mode fiber in this wavelength range. This can have a significant effect especially if the delay section has a comparatively long optical length.

In particular, the light source is preferably operated with at least one oligomode fiber or the light source comprises an oligomode fiber when an optical loss caused by unequal attenuation constants for different modes propagating in the oligomode fiber during operation is less than or equal to a gain, wherein the gain can be attributed to a reduced loss on account of better quality features of the oligomode fiber, in comparison with a single mode fiber at the same wavelength.

In accordance with at least one embodiment of the light source, at least 10% of the period of time $\tau$ is attributed to an optical length of the delay section and/or of the oligomode fiber. In other words, the oligomode fiber and/or the delay section contribute(s) to the extent of at least 10% to the temporal delay between the light pulse and the copy or duplicate of the light pulse which are emitted by the light source. Preferably, this contribution is at least 20%, in particular at least 40%. Particularly preferably, the period of time $\tau$ is attributed substantially completely to the oligomode fiber and/or the delay section, that is to say, for example, to the extent of at least 90% or to the extent of at least 95%. In other words, an optical length of the oligomode fiber and/or of the delay section can then significantly exceed an optical length of all other parts of the light source.

In accordance with at least one embodiment of the light source, a core diameter of the oligomode fiber is between 7.5 μm and 9.5 μm inclusive. In a step-index fiber, for example, the core diameter is the diameter or the average diameter of the region that exhibits an increased refractive index in comparison with a cladding. In the case of a graded-index fiber, in particular, the core diameter or effective core diameter can also be a mode field diameter or an average mode field diameter.

In accordance with at least one embodiment of the light source, the optical length of the oligomode fiber and/or of the delay section is between 10 m and 100 km inclusive, in particular between 100 m and 30 km inclusive, preferably between 200 m and 15 km inclusive. The optical length is, in particular, a geometrical length of the oligomode fiber and/or of the delay section, multiplied by the effective refractive index. Preferably, the length of the delay section corresponds to the length of the oligomode fiber.

In accordance with at least one embodiment of the light source, a spectral width of a tuning range of the radiation from the light source emitted during operation is at least 5 nm, preferably at least 20 nm, in particular at least 50 nm. In other words, the wavelength of the radiation emitted by the light source is tunable, preferably continuously tunable, over at least one of the stated ranges.

In accordance with at least one embodiment of the light source, the spectral tuning range of the emitted radiation is less than 300 nm, in particular less than 120 nm.

In accordance with at least one embodiment of the light source, a wavelength range of the radiation emitted during operation is between 950 nm and 1250 nm inclusive, in particular between 1000 nm and 1150 nm inclusive. In other words, the light source emits radiation predominantly or exclusively in the stated spectral range.

In accordance with at least one embodiment of the light source, the oligomode fiber and/or the delay section is partly or, preferably, completely rolled up. In this case, completely rolled up does not rule out the situation where a negligible part in comparison with a total length of the oligomode fiber and/or of the delay section, in particular a part for connection purposes, is not rolled up. By way of example, therefore, more than 90%, in particular more than 98%, of the oligomode fiber and/or of the delay section is rolled up.

In accordance with at least one embodiment of the light source, a bending radius or an average bending radius of the rolled-up oligomode fiber and/or of the rolled-up delay section is at least 2 cm and at most 50 cm, in particular at least 5 cm and at most 25 cm. In other words, the delay section and/or the oligomode fiber are/is comparatively tightly bent. Setting the bending radius can make it possible to influence a mode dispersion and/or a chromatic dispersion of the delay section and/or of the oligomode fiber. The same can correspondingly apply to a polarization dispersion, a polarization rotation and/or a mode-dependent attenuation. Preferably, the polarization dispersion, the polarization rotation and/or the mode-dependent attenuation can furthermore be influenced in a targeted manner by controlled, in particular mechanical, straining of the oligomode fiber.

In accordance with at least one embodiment of the light source, the delay section includes at least two coils each having one oligomode fiber or each having a plurality of oligomode fibers. In the case of two coils, this can mean that two different carriers are present, on each of which one or a plurality of the oligomode fibers is/are rolled up. It is likewise possible for the two coils to have a common carrier, for example, a roll, but the oligomode fibers of the respective coils are optically and/or functionally separate from one another. Functionally separate can mean that different portions of radiation cover different light paths through the delay section. By way of example, one portion of radiation passes through only one of the coils and a further portion of radiation passes through all or a plurality of the coils.

In accordance with at least one embodiment of the light source, the coils or the oligomode fibers of the respective coils have mutually different optical lengths. Preferably, the optical lengths of the individual coils or oligomode fibers are fashioned different from one another in a targeted manner in pairs, in particular.

In accordance with at least one embodiment of the light source, for the optical length $L_{opt}$ of the oligomode fiber, with a tolerance of at most 10%, in particular of at most 2%, the following relationship holds true:

$$L_{opt} = c/(N\tau),$$

where c is the speed of light in a vacuum and N is a natural number greater than or equal to 1.

In accordance with at least one embodiment of the light source, at least one of the coils has an optical length that is an integral multiple of the optical length of the coil which has the shortest optical length. In particular, the lengths follow the relationship that the optical length $L_N$ of the N-th coil is equal to $2^N$ times the optical length $L_0$ of the coil having the shortest optical length. In this case, N is a natural number greater than or equal to 1.

In accordance with at least one embodiment of the light source, parts of the coils are arranged relative to other parts of the respective coil in a manner tilted in relation to one another. That can mean that a first plane is defined by one or a plurality of windings of the coil and a second plane is defined by one or a plurality of other windings of the same coil. The first plane is then tilted by an angle relative to the second plane. The angle between the planes is preferably between 30° and 100° inclusive, in particular between 70° and 95° inclusive. Furthermore, one or each of the coils can have two or more than two planes that are defined by windings of the coil and that are arranged in a manner tilted in relation to one another.

In accordance with at least one embodiment of the light source, a bridging section is optically connected in parallel with the delay section and/or the oligomode fiber. Optically connected in parallel can mean that the delay section and the bridging section are two partial sections of the light source that are split by a beam splitter. The bridging section is preferably based on an optical fiber.

In accordance with at least one embodiment of the light source, an optical length of the bridging section is less than the optical length of the delay section. Preferably, the optical length of the bridging section is negligible relative to the optical length of the delay section. Negligible can mean that the length of the bridging section is at most 10%, in particular at most 5%, particularly preferably at most 1%, of the length of the delay section.

In accordance with at least one embodiment of the light source, a tuning rate of the radiation emitted by the light source during operation is multiplied by means of the delay section. By way of example, a copy or a duplicate of a light pulse emitted by the light source passes through the delay section once and is coupled out only afterward, wherein the initial original light pulse does not pass through the delay section. The tuning rate of the light source can be doubled as a result. With the use of, for example, two coils and/or a delay section divided into two, the tuning rate can be quadrupled.

In accordance with at least one embodiment of the light source, the tuning rate of the wavelength of the emitted radiation is at least 1 kHz, in particular at least 10 kHz, preferably at least 30 kHz or at least 100 kHz. The period of time τ is then preferably at most 1 ms, in particular at most 100 μs or at most 33 μs or at most 10 μs. In other words, the wavelength emitted by the light source is rapidly tunable.

In accordance with at least one embodiment of the light source, a relative time proportion in which the light source emits the radiation on average during operation is at least 1%. That is to say that the light source is then, in particular, not a short-pulse light source that emits radiation only in a short time range, relative to a total effective operating time. Thus, in contrast thereto for instance in the case of lasers having repetition rates in the kilohertz range, which generate nanosecond light pulses, or in the case of femtosecond light sources having repetition rates in the megahertz range, radiation is emitted only to a comparatively small relative time proportion of approximately $10^{-6}$. In the remaining time proportion, within the scope of the operating tolerances, no radiation is emitted in the case of such light sources.

In accordance with at least one embodiment of the light source, the delay section and/or the oligomode fiber are/is designed such that the radiation emitted during operation passes through it at least twice or at least four times. That is to say that a specific portion of the radiation or the entire radiation passes multiply through the delay section and/or the oligomode fiber.

In accordance with at least one embodiment, the light source is a laser. That is to say that the radiation emitted by the light source can be a coherent radiation.

In accordance with at least one embodiment, the light source includes a resonator. The resonator can be a laser resonator.

In accordance with at least one embodiment of the light source, the resonator of the light source includes the delay section and/or the oligomode fiber or one of the oligomode fibers. That is to say that the delay section and/or the oligomode fiber are/is then part of the resonator.

In accordance with at least one embodiment of the light source, the delay section and/or the oligomode fiber and/or one or all of the oligomode fibers are/is disposed downstream of the resonator. In other words, it is possible for the light source to include a resonator and for the delay section to be positioned outside, downstream of the resonator in a beam direction. In this case, only radiation that has already been coupled out from the resonator passes to the delay section and/or to the oligomode fiber. It is likewise possible for the delay section and/or the oligomode fiber to be disposed downstream of all other partial sections of the light sources or all partial sections with the exception of a single partial section in the beam direction.

In accordance with at least one embodiment of the light source, apart from the delay section and/or the oligomode fiber, all fiber-based parts of the resonator or all further partial sections of the light source are fashioned with single mode fibers. Fiber-based parts are, for example, fiber amplifiers, polarization control units or fiber Fabry-Perot filters.

In accordance with at least one embodiment, the light source includes an amplitude modulator and/or a phase modulator designed for tuning the wavelength. Alternatively or additionally, the light source can include a current source designed for temporally variable energization, wherein the wavelength can at least partly be set by way of the energization.

In accordance with at least one embodiment, the light source includes a compensator, which includes at least one optical element and which is designed to partly or completely compensate for a chromatic dispersion brought about by the delay section with the oligomode fiber. Preferably, at least one such optical element of the compensator is a so-called chirped fiber Bragg grating ("cFBG"). The cFBG can be produced or written directly in the oligomode fiber. It is likewise possible for the cFBG to be produced in a piece of a single mode fiber, wherein the piece is connected to the oligomode fiber by means of a splice, in particular. In order to compensate for higher-order contributions of the chromatic dispersion brought about by the oligomode fiber, it is also possible to use a plurality of cFBGs. The cFBGs are connected to one another via a so-called 4-port circulator, for example.

In accordance with at least one embodiment, the light source includes a radiation source exhibiting spectrally broadband emission, which radiation source emits, in particular, no coherent radiation, and a tunable optical bandpass filter. Preferably, the light source includes two or more than two tunable optical bandpass filters.

In accordance with at least one embodiment, the light source includes a microelectromechanical system ("MEMS"), for setting the wavelength of the radiation to be emitted. The MEMS can be a Fabry-Perot-like filter, for example as specified in the document US 2006/0072632 A1 or in the document "Single transverse mode optical resonators," Optics Express, Vol. 13, No. 1, pages 171 to 181, from Jan. 10, 2005. The disclosure content of the documents with regard to the MEMS is incorporated by reference.

In accordance with at least one embodiment, the light source includes a rotating or rapidly angle-variable mirror, in particular a polygon minor, for setting the wavelength of the radiation to be emitted. Such a minor is specified, for example, in the document "High-speed wavelength-swept semiconductor laser with a polygon-scanner-based wavelength filter," Optics Letters, Vol. 28, No. 20, pages 1981 to 1983, from Oct. 15, 2003. The disclosure content of the document with regard to the minor is incorporated by reference.

In accordance with at least one embodiment of the light source, the radiation runs within the light source substantially completely in condensed matter, in particular in solids. Substantially can mean that there are only, for example, air gaps at fiber plug connections or Fabry-Perot filters. For example, at least 99% or at least 99.9% of the light path in the light source is then in condensed matter.

In accordance with at least one embodiment, the light source is a Fourier domain mode locked laser. In particular, the light source is then designed for optical coherence tomography.

In accordance with at least one embodiment, the light source is designed for optical data transmission. The light source then preferably includes at least one transmission section, wherein the transmission section is optically connected in parallel with the delay section or the delay section simultaneously partly or completely forms the transmission section. The wavelength range of the radiation generated during operation of the laser is different from a transmission wavelength range. By way of example the radiation emitted by the light source is at approximately 1050 nm and the transmission wavelength range is centered around 1300 nm. The delay section and the transmission section have, with a tolerance of at most 1%, identical optical lengths, relative to the respectively relevant spectral range. Furthermore, the transmission section is a single mode fiber in the transmission wavelength range lying especially at longer wavelengths.

In accordance with at least one embodiment, wherein the light source is designed for optical data transmission, a wavelength tuning range of the emitted radiation is between 10 MHz and 100 GHz inclusive. The wavelength tuning range is then comparatively narrow.

The light source can be used for generating temporally wavelength-variable radiation, in particular for imaging tasks, measurement tasks, for information transmission, for sensor technology and for profilometry.

A light source described here is explained in greater detail below on the basis of exemplary embodiments with reference to the drawing. In this case, identical reference symbols indicate identical elements in the individual figures. In this case, however, relationships to scale are not illustrated; rather, individual elements may be illustrated with an exaggerated size in order to afford a better understanding.

BRIEF DESCRIPTION OF THE DRAWINGS

In the figures:
FIGS. 6A and 6B, collectively

DETAILED DESCRIPTION OF ILLUSTRATIVE EMBODIMENTS

Figure 1:
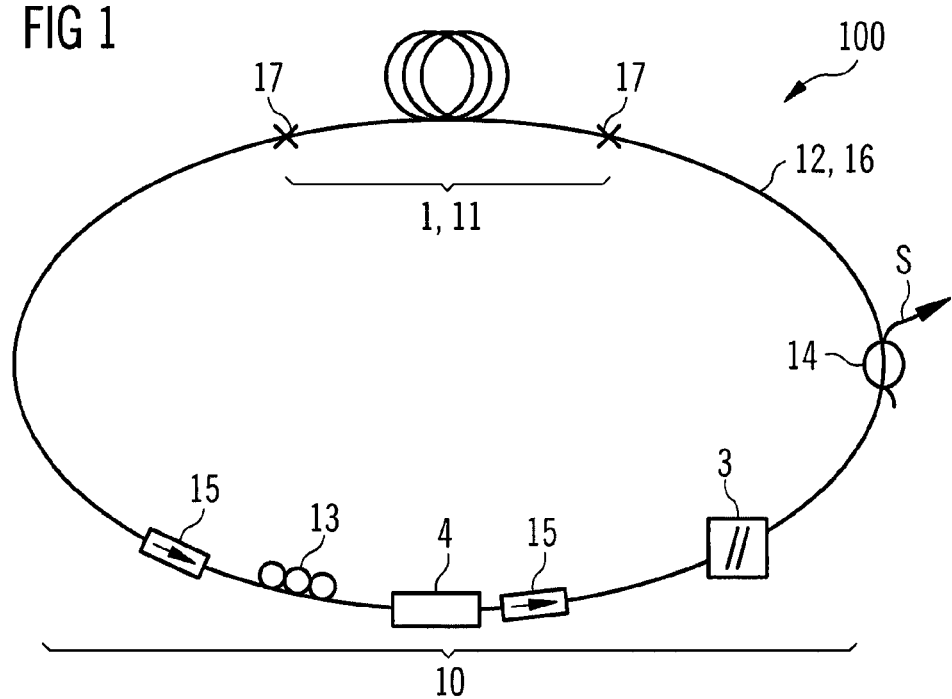
FIGS. 1, 4, 5, 7, 9 and 10 show schematic illustrations of exemplary embodiments of wavelength-tunable light sources described here.

FIG. 1 illustrates a schematic construction of a light source 100 described here. The light source 100 in accordance with FIG. 1 is a Fourier domain mode locked laser, for example, for optical coherence tomography.

An optical amplifying medium 4 is, for example, a semiconductor optical amplifier ("SOA"). Alternatively or additionally, a fiber amplifier can be used as the amplifying medium 4. Wavelength selection is effected via a tunable optical filter 3. By way of example, the optical filter 3 is a fiber Fabry-Perot filter. A fiber coupler 14 is disposed downstream of the filter 3 in a circulation direction. By way of example, 30% of the light intensity is coupled out via the fiber coupler. A radiation S coupled out at the fiber coupler 14 is emitted by the light source 100.

Furthermore, the light source 100 includes a delay section 1, which is formed completely by an oligomode fiber 11. The delay section 1 is incorporated by means of splices 17 into a resonator 10 of the light source 100. The resonator includes the further components of the light source 100. A transition from the single mode fiber 16 to the oligomode fiber 11 can also be effected via plug connections. The delay section is formed, for instance, by a fiber of the SMF 28 type from Corning or by a fiber of the Allwave ZWP type from OFS. The oligomode fiber 11 has, for example, a geometric length of approximately 3.5 km, corresponding to an optical length of approximately 5.14 km given a refractive index of the fiber of 1.468. Reference 12 refers to the fiber-based part of the resonator.

All other fiber-based parts of the resonator 10, that is to say all fiber-based parts apart from the delay section 1, are realized by single mode fibers 16. The single mode fibers 16 are, in particular, fibers of the HI 1060 type from Corning.

The delay section 1 and thus the oligomode fiber 11 are completely wound onto a coil having a diameter of approximately 30 cm. By setting the radius of curvature of the coil, it can be possible to realize removal of undesired modes of specific order by attenuation. By means of a targeted spatial orientation relative to an axis of curvature of the coil or of parts of the coil and of the oligomode fiber 11, it is furthermore possible to control losses of higher-order modes.

Furthermore, the resonator 10 includes a polarization control unit 13 and optionally one or a plurality of optical isolators 15. A transmission direction of the isolators 15 is indicated by arrows in FIG. 1. The sequential orders of the components of the light source 100, as illustrated in FIG. 1, can be permuted.

Figure 2:
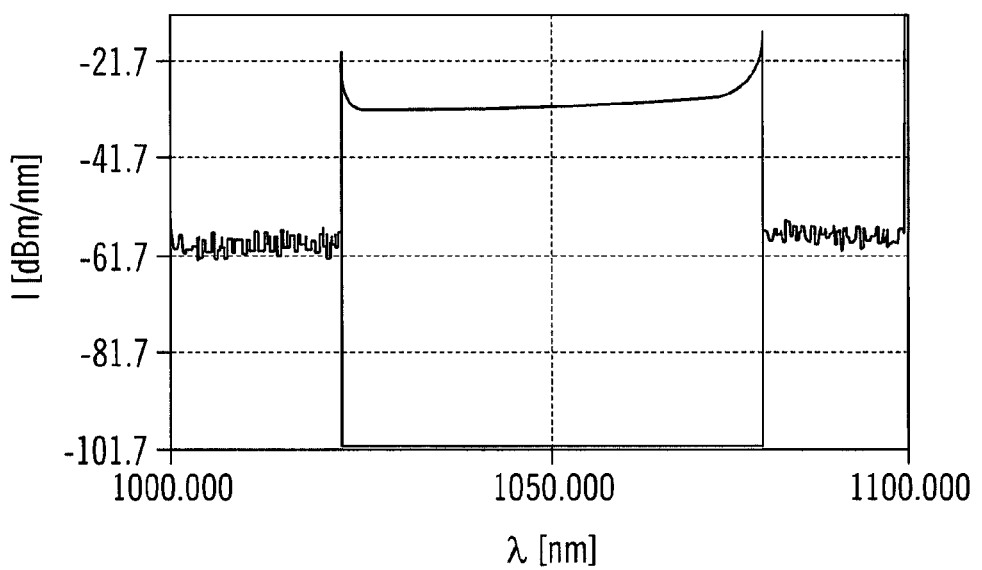
FIGS. 2 and 3 show schematic illustrations for characterizing a radiation emitted by light sources described here.

FIG. 2 illustrates a spectrum of the light source 100 constructed in accordance with FIG. 1. A wavelength-dependent intensity I in dB is plotted against the wavelength $\lambda$ of the radiation S in nm. The radiation S is centered around 1050 nm. A tuning range of the radiation is approximately 57 nm. In other words, the light source 100 can emit radiation in the spectral range of from approximately 1025 nm to approximately 1080 nm. The radiation is tuned by means of 2×53867 bidirectional wavelength passes in the resonator 10 per second. A time dependence of the wavelength $\lambda$ of the radiation S can be configured sinusoidally or in sawtooth-like fashion.

Figure 3:
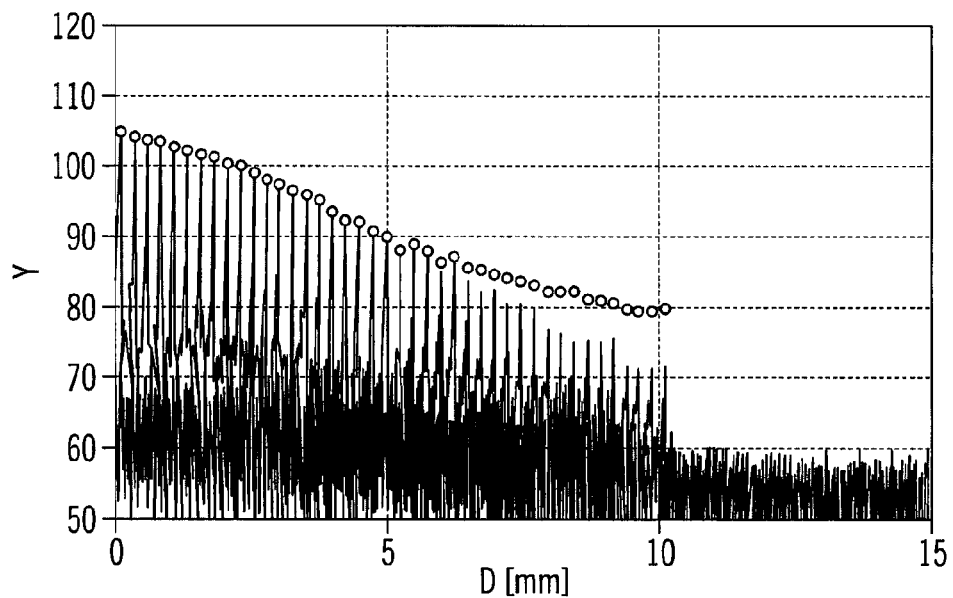

FIG. 3 illustrates an amplitude of an interference signal Y—detected by means of a photodiode—of the radiation S, which was guided via a Mach-Zehnder interferometer. In this case, the vertical lines in FIG. 3 indicate a Fourier transform of the interference signal Y. The path length difference D between interferometer arms of the interferometer in mm is represented as the abscissa. The interference signal Y is plotted in arbitrary units logarithmically relative to the path length difference D.

It is evident from FIG. 3 that a distinct interference signal Y is still detectable at least up to a path length difference D of approximately 10 mm. A coherence length, a resolution and a dynamic range of the radiation S of the light source 100 are accordingly suitable for use for optical coherence tomography on the human eye, for example.

Figure 4:
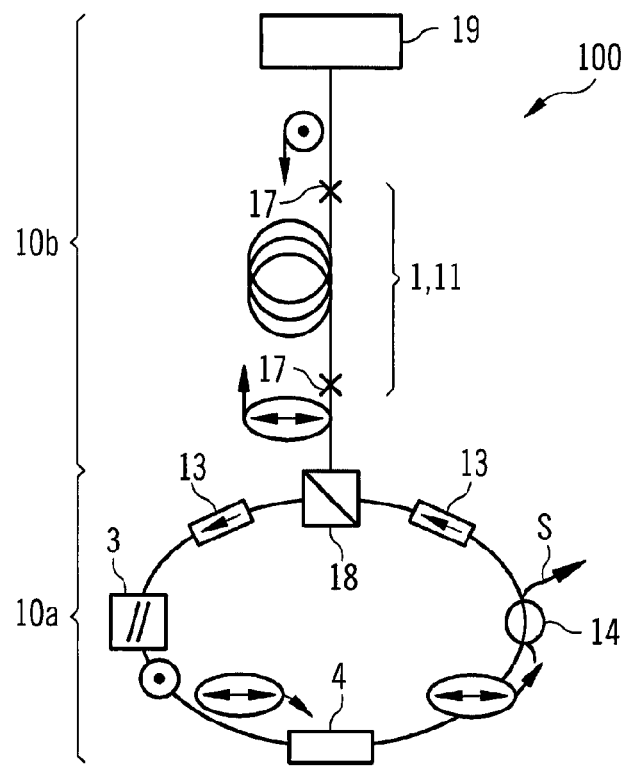

FIG. 4 illustrates a further exemplary embodiment of the light source 100. The light source 100 includes a resonator part 10a, in which the amplifying medium 4 and the filter 3 are situated. Via a beam splitter 18 that reflects in a polarization-dependent manner, the resonator part 10a is connected to a resonator part 10b or coupled thereto. Instead of the beam splitter 18, it is also possible to use an optical circulator, a polarization-independent beam splitter embodied as a partly transmissive mirror, or a fiber coupler. The delay section 1 with the oligomode fiber 11 is situated in the resonator part 10b, the delay section being incorporated by means of the splices 17. A Faraday mirror 19 is situated at a side of the resonator part 10b that is remote from the beam splitter 18 that reflects in a polarization-dependent manner. By means of the Faraday minor 19, a polarization rotation of the radiation circulating in the resonator 10a, 10b is effected upon reflection. A polarization direction of the radiation and also the propagation direction of the radiation are symbolized by arrows and dots. The radiation circulating in the resonator 10a, 10b passes twice through the delay section 1 formed with the oligomode fiber 11. The light source illustrated in FIG. 4 can be constructed analogously to the light sources specified in International Patent Publication WO 2008/135034 A1. The disclosure content of the document with regard to the light sources specified is hereby incorporated by reference.

Figure 5:
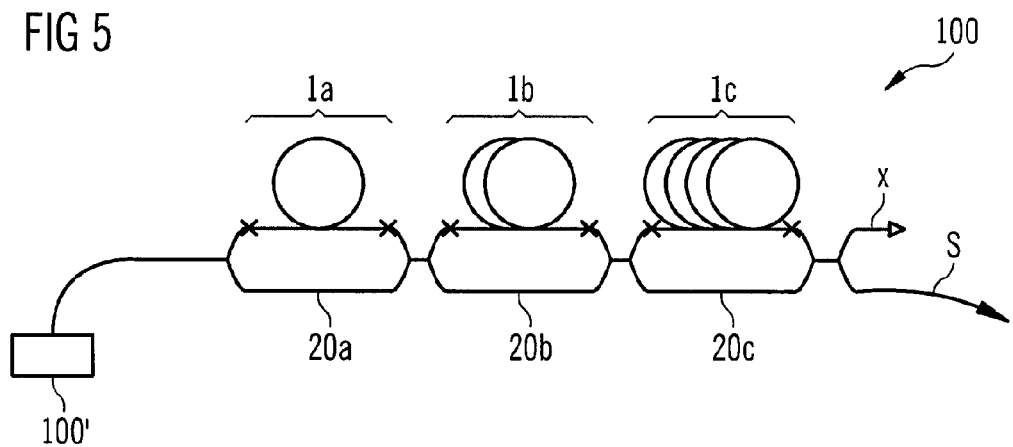

FIG. 5 illustrates an exemplary embodiment of the light source 100 wherein bridging sections 20a, 20b, 20c are respectively optically connected in parallel with the delay sections 1a, 1b, 1c. An optical length of the delay section 1b is double, and an optical length of the delay section 1c is quadruple, the optical length of the delay section 1a.

The part 100' of the light source 100 in accordance with FIG. 5 can be, for example, a light source in accordance with FIG. 1 or in accordance with FIG. 4. The part 100' of the light source 100 can also be a spectrally filtered broadband source.

It is likewise possible for the part 100' of the light source 100 to be a tunable laser with a bandpass filter.

The bandpass filter can then be a Fabry-Perot filter based on a rotating, rapidly angle-variable minor or polygon minor, in particular in combination with a dispersive optical element, and/or a microelectromechanical system ("MEMS"). Furthermore, the part 100' of the light source 100 can contain a resonator with a resonantly operated minor with a galvanometer drive, in particular in combination with an optically dispersive element.

By means of a delay section fashioned in this way with a plurality of parts 1a, 1b, 1c wound in coils, a tuning rate of the radiation S emitted by the light source 100 can be multiplied, in particular octupled in accordance with FIG. 5. Optionally, the light source 100 can have a second radiation output X. Furthermore, it is optionally possible, as also in all the other exemplary embodiments, for the radiation S to pass through a post-amplifier, for example, an SOA, not depicted in the figures. It is possible in this case to set an energization of the SOA such that all the light pulses emitted by the light source 100, that is to say both the original light pulse and the copies or duplicates thereof, have identical or approximately identical intensities.

Figure 6:
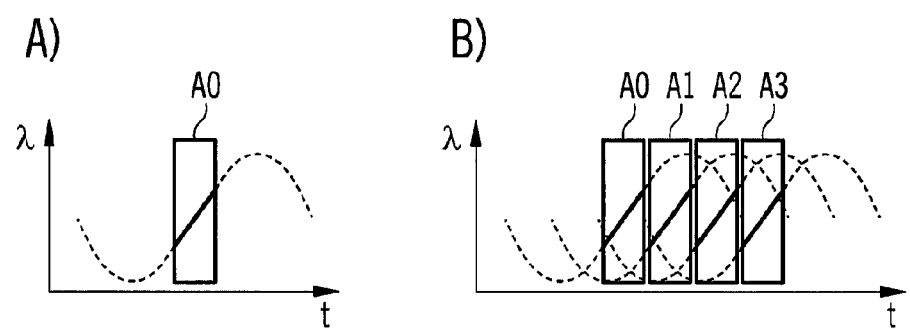
FIG. 6, shows a schematic illustration of multiplication of the tuning rate in a light source described here.

FIG. 6 schematically illustrates a principle for multiplying the tuning rate by means of a delay section. In FIGS. 6A, 6B, the wavelength $\lambda$ of the radiation emitted by the light source 100 is in each case plotted against the time t. In accordance with FIG. 6A, the radiation S is emitted only in the time window A0.

In accordance with FIG. 6B, the radiation S is emitted in four time windows A0, A1, A2, A3. In this case, the time windows A1, A2, A3 represent copies or duplicates of the light pulse from the time window A0, caused by passing through the delay section of the light source 100. A temporal profile of the wavelength $\lambda$ of the radiation S is approximately sawtooth-like.

Figure 7:
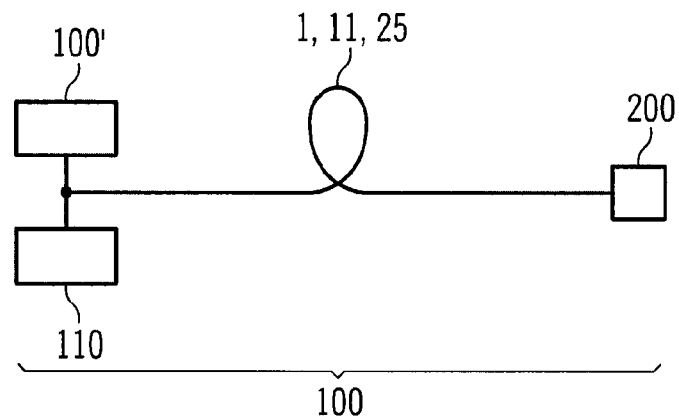

In the exemplary embodiment of the light source 100 in accordance with FIG. 7, the delay section 1 is formed, for example, by a fiber of the SMF 28 type from Corning. The delay section 1 simultaneously constitutes an optical transmission section 25. Radiation from the part 100' and from the part 110 of the light source 100 is coupled into the delay section 1. The part 100' generates, for example, radiation around 1050 nm, and the part 110 generates radiation around 1300 nm, independently of the radiation around 1050 nm. The fiber represents a single mode fiber for the radiation around 1300 nm, and an oligomode fiber for the radiation of the part 100'. The number of modes guided by a fiber is dependent on the wavelength of the radiation guided. Consequently, it is also dependent on the wavelength of the radiation whether the fiber is a single mode fiber or an oligomode fiber. The transmitted radiation is detected by means of a detection unit 200, for example.

Figure 8:
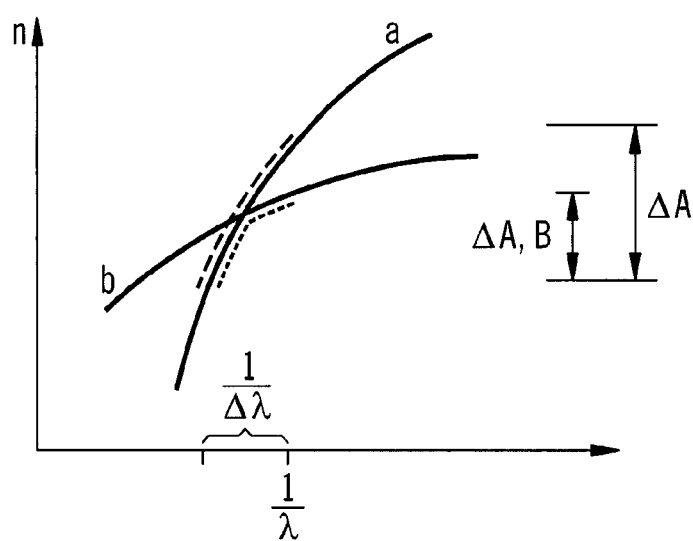
FIG. 8 shows a schematic illustration of the mode dispersion in an oligomode fiber.

In FIG. 8, a refractive index n of the oligomode fiber 11 is schematically plotted as a function of the wavelength $\lambda$ of the radiation S, both for the fundamental mode, see curve b, and for the first higher mode, see curve a. In the relevant wavelength range, for example, around 1050 nm, an average gradient of the curve a is greater than an average gradient of the curve b. A refractive index difference $\Delta A$ in the tuning range $\Delta \lambda$ can therefore, relative to the curve a, overall be greater than the refractive index difference $\Delta A, B$, for the case where both the fundamental mode and the first higher mode are supported by the delay section. In other words, it is possible for a chromatic dispersion to be manifested to a lesser extent in the case of an oligomode fiber than in the case of a single mode fiber. A wavelength tuning accuracy within the light source 100 and in association therewith also an increase in the efficiency of the light source 100 can be obtainable as a result.

Figure 9:
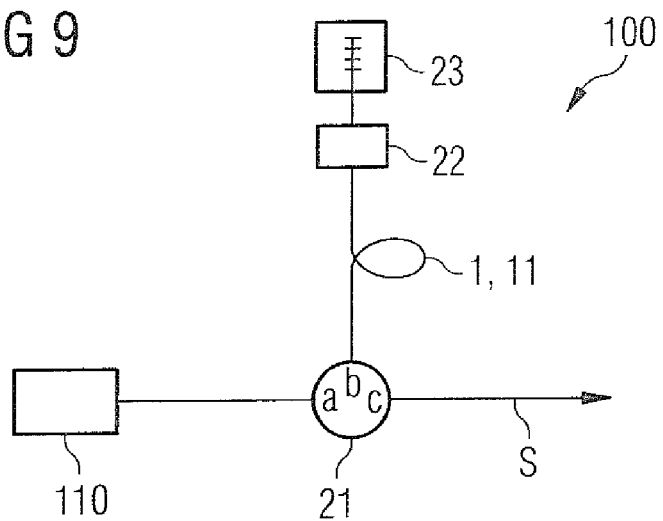

A further exemplary embodiment of the light source 100 is illustrated in FIG. 9. A circulator 21 comprising three connections a, b, c is disposed downstream of the part 110 of the light source 100 containing the optical amplifier medium, for example. Light radiated into the connection a of the circulator 21 is emitted at the connection b. Light entering the circulator 21 in the connection b is forwarded to the connection c. Light entering into the circulator 21 via the connection c is not forwarded.

The connection b is adjoined by the delay section 1 with the oligomode fiber 11. A chirped fiber Bragg grating 23 ("cFBG"), is situated at an end of the delay section 1 remote from the circulator 21, the delay section optionally including a Faraday rotator 22. The cFBG 23 is a fiber that has a modulated refractive index along a main propagation direction and thereby acts like a Bragg mirror. Chirped means that a penetration depth into the cFBG 23 varies for light having different wavelengths. Depending on the wavelength, therefore, the light in the cFBG 23 covers different path lengths. It is thereby possible to partly or completely compensate for a chromatic dispersion on account of the oligomode fiber 11.

In accordance with FIG. 9, the radiation S is emitted after reflection at the cFBG 23 and after once again passing through the delay section 1 and the circulator 21. In a departure therefrom, a further part (not depicted) of the light source 100 can be disposed downstream of the connection c of the circulator 21.

Figure 10:
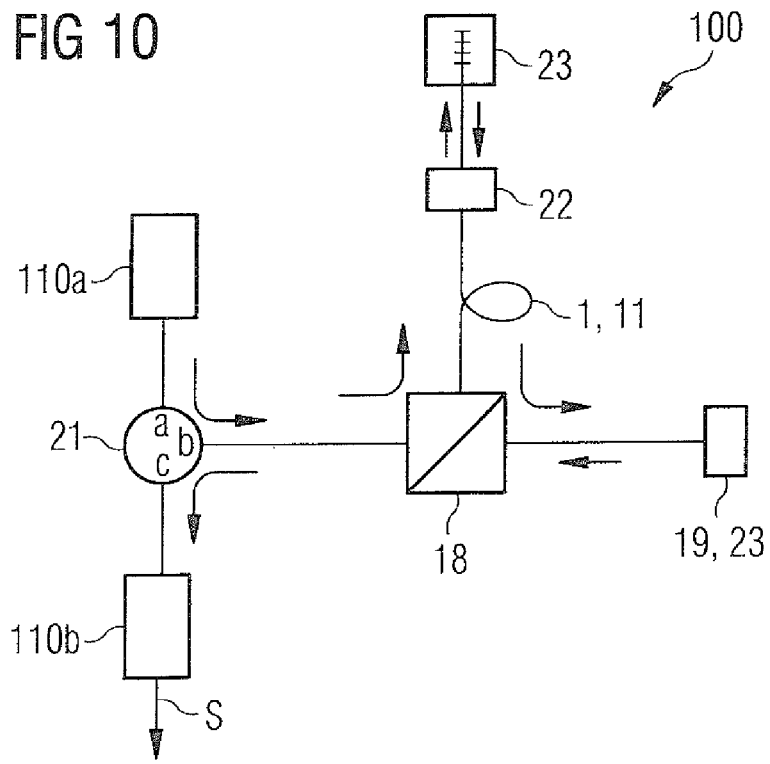

In the exemplary embodiment in accordance with FIG. 10, the delay section 1 with the oligomode fiber 11 and the cFBG 23 is situated between the parts 110a, 110b of the light source 100. The Faraday rotator 22 is once again optional. The propagation direction of the radiation is symbolized by arrows.

From the part 110a, the radiation is directed via the circulator 21 toward the beam splitter 18 that reflects in a polarization-dependent manner. The beam splitter 18 reflects the radiation toward the delay section 1, to which the cFBG 23 is connected or into which the cFBG 23 is integrated for compensation of dispersion. The delay section 1 is traversed twice overall. Afterward, after passing through the beam splitter 18, the radiation impinges on a further cFBG 23 or on the mirror 19 and is reflected back in the direction of the circulator 21. Finally, the radiation passes via the connection b to the part 110b of the light source 100.

The invention described here is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

LIST OF REFERENCE SYMBOLS

100 Wavelength-tunable light source
110 Part of the light source
10 Resonator/partial section
1 Delay section
3 Optical filter
4 Optical amplifying medium
11 Oligomode fiber
12 Fiber-based part of the resonator
13 Polarization controller
14 Optical coupler
15 Optical isolator
16 Single mode fiber
17 Splice
18 Beam splitter that reflects in a polarization-dependent manner
19 Mirror
20 Bridging section
21 Circulator
21 Faraday rotator
23 Chirped fiber Bragg grating (cFBG)
25 Transmission section
200 Detection unit
a,b,c Connections of the circulator
A Activity window
D Arm length difference
S Emitted radiation
t time
X Control output
Y Signal amplitude
λ Wavelength

The invention claimed is:

1. A wavelength-tunable light source comprising:
   at least one fiber-based partial section; and
   at least one delay section formed with at least one oligomode fiber;
   wherein the following relationship holds true for a wavelength λ of at least one portion of radiation emitted by the light source as a function of time t:

$$\lambda(t)=\lambda(t-\tau)$$

where τ is a fixed period of time greater than zero, wherein the wavelength range of the emitted radiation is between 950 nm and 1250 nm, inclusive, and wherein the oligomode fiber in said wavelength range of the radiation emitted by the light source is designed to guide between 2 modes and 20 modes, inclusive.

2. The light source according to claim 1, wherein the light source is a Fourier domain mode locked laser.

3. The light source according to claim 2, further comprising:
   an amplifier medium;
   a tunable optical filter for wavelength selection and for periodic tuning of the wavelength of the emitted radiation; and
   a fiber coupler for coupling out the radiation from the light source;
   wherein the delay section is a part of the fiber-based partial section; and
   wherein the amplifier medium, the optical filter and the delay section are situated in a resonator of the light source.

4. The light source according to claim 1, wherein at least 10% of the period of time τ is attributed to an optical length of the oligomode fiber.

5. The light source according to claim 1, wherein a core diameter of the oligomode fiber is between 7.5 μm and 9.5 μm, inclusive.

6. The light source according to claim 1, wherein the delay section has an optical length of between 10 m and 50 km, inclusive.

7. The light source according to claim 1, wherein a spectral width of a tuning range of the radiation emitted during operation is at least 5 nm and at most 300 nm.

8. The light source according to claim 1, wherein the delay section comprises at least two coils, each coil having one or more oligomode fibers;
   wherein the coils have mutually different optical lengths; and wherein one of the coils has an optical length that is an integral multiple of the optical length of the coil having the shortest optical length.

9. The light source according to claim 1, further comprising a bridging section optically connected in parallel with the delay section, wherein an optical length of the bridging section is less than the optical length of the delay section.

10. The light source according to claim 1, wherein a tuning rate of the radiation emitted during operation is multiplied by the delay section.

11. The light source according to claim 1, wherein a tuning rate of the wavelength λ of the emitted radiation is at least 1 kHz, wherein a relative time proportion in which the light source emits the radiation on average during operation is at least 1%.

12. The light source according to claim 1, wherein the delay section is designed such that the radiation emitted during operation passes through it at least twice or at least four times.

13. The light source according to claim 1, wherein the light source a laser.

14. The light source according to claim 13, wherein a resonator of the light source comprises the oligomode fiber.

15. The light source according to claim 14, wherein, apart from the delay section, all fiber-based parts of the resonator are fashioned with single mode fibers.

16. The light source according to claim 13, wherein the oligomode fiber is disposed downstream of a resonator of the light source.

17. The light source according to claim 1, further comprising a rotating and/or a rapidly angle-variable mirror for tuning the wavelength of the radiation to be emitted during operation.

18. The light source according to claim 1, further comprising a tunable filter, based on a microelectromechanical system, for tuning the wavelength of the radiation to be emitted during operation.

19. The light source according to claim 1, wherein the light source is designed for optical coherence tomography.

20. A wavelength-tunable Fourier domain mode locked laser, comprising:
 a resonator;
 an amplifier medium in the resonator;
 a tunable optical filter in the resonator, wherein the filter is designed for wavelength selection and for periodic tuning of a wavelength of emitted radiation, wherein the wavelength range of the emitted radiation is between 950 nm and 1250 nm, inclusive;
 a fiber coupler for coupling out the radiation from the resonator;
 at least one fiber-based partial section in the resonator; and
 at least one delay section that is a part of the fiber-based partial section and that is formed of at least one oligomode fiber, wherein the oligomode fiber in a wavelength range of the radiation emitted by the laser is designed to guide between 2 modes and 20 modes, inclusive;
 wherein the following relationship holds true for a wavelength λ of at least one portion of a radiation emitted by the laser as a function of time t:

$$\lambda(t)=\lambda(t-\tau)$$

where τ is a fixed period of time greater than zero.

* * * * *